(12) United States Patent
Huang et al.

(10) Patent No.: US 11,405,022 B2
(45) Date of Patent: Aug. 2, 2022

(54) FILTER NETWORKS FOR DRIVING CAPACITIVE LOADS

(71) Applicant: MEDIATEK Singapore Pte. Ltd., Singapore (SG)

(72) Inventors: Bryan Liangchin Huang, Los Altos, CA (US); Osama Khalil Shanaa, San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/209,832

(22) Filed: Dec. 4, 2018

(65) Prior Publication Data

US 2019/0199327 A1 Jun. 27, 2019

Related U.S. Application Data

(60) Provisional application No. 62/609,468, filed on Dec. 22, 2017.

(51) Int. Cl.
*H03H 11/12* (2006.01)
*H03F 3/19* (2006.01)
*H03F 3/45* (2006.01)

(52) U.S. Cl.
CPC ........... *H03H 11/1269* (2013.01); *H03F 3/19* (2013.01); *H03F 3/45475* (2013.01); *H03H 11/1217* (2013.01); *H03F 2203/45526* (2013.01)

(58) Field of Classification Search
CPC .. H03H 11/1217; H03H 11/1269; H03F 3/19; H03F 3/45475
See application file for complete search history.

(56) References Cited

U.S. PATENT DOCUMENTS

| | | | |
|---|---|---|---|
| 3,999,137 A | 12/1976 | Fucito | |
| 4,430,626 A | 2/1984 | Adams | |
| 4,975,653 A * | 12/1990 | Kennedy | H03D 3/00 329/318 |
| 6,429,734 B1 * | 8/2002 | Wang | H03F 3/45941 327/156 |

(Continued)

FOREIGN PATENT DOCUMENTS

| | | |
|---|---|---|
| DE | 2608401 A1 | 9/1977 |
| EP | 2874313 A1 | 5/2015 |

OTHER PUBLICATIONS

Partial European Search Report dated May 24, 2019 in connection with European Application No. 18214150.7.

(Continued)

*Primary Examiner* — Diana J. Cheng
*Assistant Examiner* — Colleen J O Toole
(74) *Attorney, Agent, or Firm* — Wolf, Greenfield & Sacks, P.C.

(57) ABSTRACT

According to at least one aspect, a filter network is provided. The filter network comprises: an active filter comprising an amplifier (e.g., an operational amplifier), wherein the active filter is configured to add at least one member selected from the group consisting of a pole and a zero to a transfer function of the filter network; a passive filter coupled to the active filter and configured to add at least one pole to the transfer function of the filter network; and a non-inverting amplifier (e.g., a voltage buffer) having an input coupled to the passive filter and an output coupled to the active filter.

20 Claims, 4 Drawing Sheets

(56) References Cited

U.S. PATENT DOCUMENTS

2006/0044057 A1    3/2006   Hezar et al.
2013/0225101 A1    8/2013   Basaran et al.
2017/0077911 A1    3/2017   Badillo et al.
2017/0346473 A1   11/2017   Bruset et al.

OTHER PUBLICATIONS

Awad, S.S., Capacitance Measurement Based on an Operational Amplifier Circuit: Error Determination and Reduction, IEEE Transactions on Instrumentation and Measurement, vol. 37, No. 3, Sep. 1998, pp. 379-382.
Pakala et al., Voltage Buffer Compensation using Flipped Voltage Follower in a Two-Stage CMOS Op-amp, 2015 IEEE $58^{th}$ International Midwest Symposium on Circuits and Systems (MWSCAS), Aug. 2, 2015, pp. 1-4.
Schaumann et al., Design of Analog Filters. 2001. New York Oxford University Press. pp. 129-136. ISBN: 978-0195118773.
Sedra et al., Fifth Edition Microelectronic Circuits. 2004. New York Oxford University Press. pp. 1123-1125. ISBN: 978-0195142525.
Extended European Search Report for European Application No. 18214150.7 dated Sep. 26, 2019.
Tsantes, Monolithic active filters come on strong; hybrid and module technologies mature. EDN Magazine-Electrical Design News. Jan. 1, 1980;25(6):49-73.

\* cited by examiner

FILTER NETWORKS FOR DRIVING CAPACITIVE LOADS

CROSS REFERENCE TO RELATED APPLICATIONS

This application is a non-provisional of U.S. Provisional Application Ser. No. 62/609,468 titled "MODIFIED LINEAR BIQUAD SUITABLE TO DRIVE LARGE CAPACITANCE LOAD," filed Dec. 22, 2017, which is incorporated herein by reference in its entirety.

BACKGROUND

1. Technical Field

The techniques described herein relate to filter networks, such as biquadratic filter networks, for driving capacitive loads.

2. Discussion of the Related Art

Figure 1:
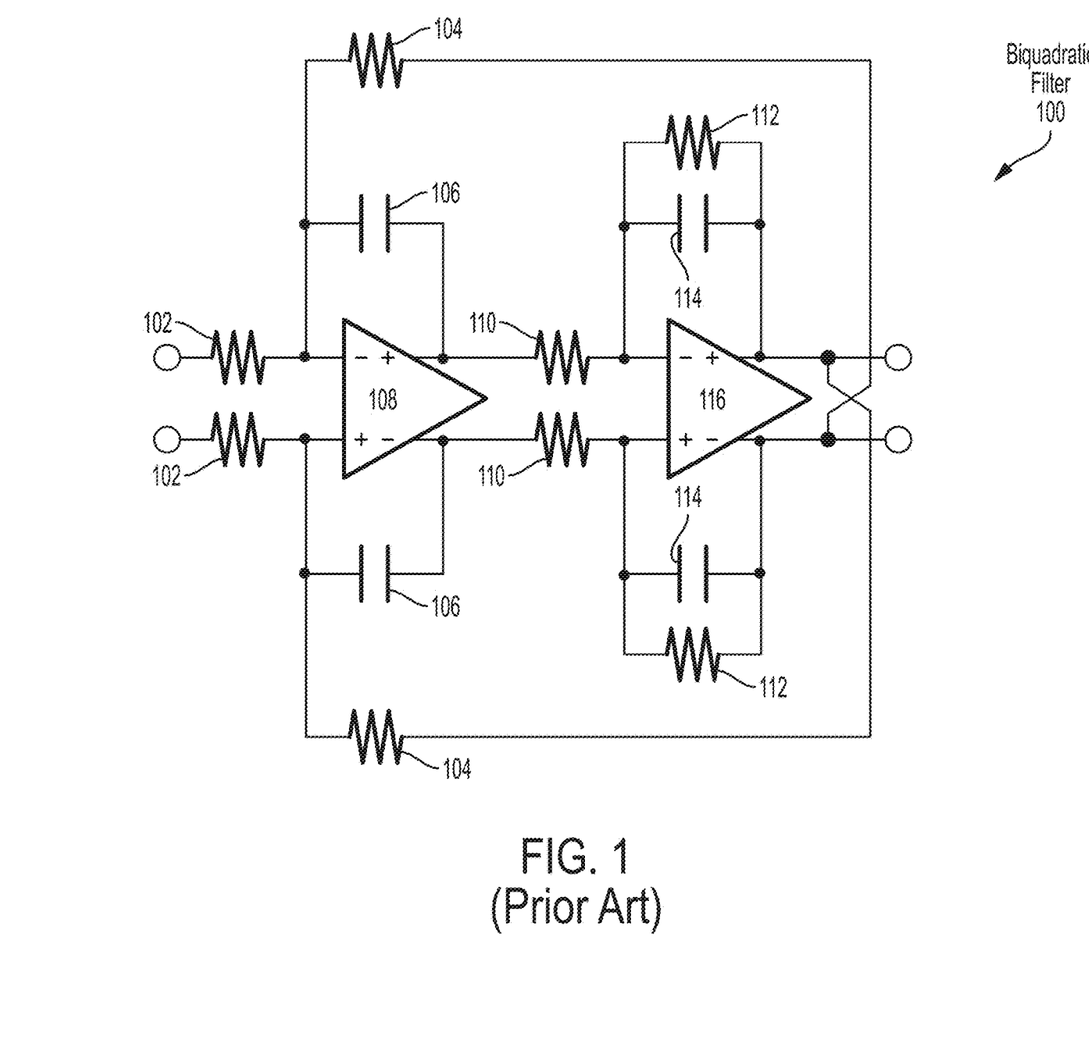
FIG. 1 is a schematic for a conventional biquadratic filter.

Biquadratic filters are filters with a transfer function that is a ratio of two quadratic functions. Quadratic functions may be polynomial functions in which the highest-degree term in each function is of the second degree. Typically, biquadratic filter networks are formed by cascading two active filters that each comprise an operational amplifier to achieve the desired transfer function. An example of such a biquadratic filter is shown in FIG. 1 by biquadratic filter 100.

The biquadratic filter 100 comprises first and second operational amplifiers 108 and 116, respectively, each with near-infinite open-loop gain and arranged with other electrical components to form an active filter. As shown, the output of the operational amplifier 108 is coupled to the input of the operational amplifier 108 in a feedback loop including capacitors 106 ($C_1$). Similarly, the output of the second operational amplifier 116 is coupled to the input of the second operational amplifier 116 in a feedback loop that comprises resistors 112 ($R_4$) and capacitors 114 ($C_2$) coupled in parallel. The output of the second operational amplifier 116 is also coupled to the input of the first operational amplifier 108 in another feedback loop that comprises resistors 104 ($R_3$). Additionally, the biquadratic filter 100 comprises resistors 102 ($R_1$) that couple the input of the biquadratic filter 100 to the input of the first operational amplifier 108 and resistors 110 ($R_2$) that couple the output of the first operational amplifier 108 to the input of the second operational amplifier 116. The derived transfer function for the biquadratic filter 100 in the s-plane is shown below in equation (1) as $T_1(s)$:

$$T_1(s) = \frac{R_3/R_1}{s^2 / \frac{1}{R_2 * C_2 * R_3 * C_1} + s / \frac{R_4/R_2}{R_3 * C_1} + 1} \quad (1)$$

SUMMARY

According to at least one aspect, a filter network is provided. The filter network comprises: an active filter comprising an amplifier (e.g., an operational amplifier), wherein the active filter is configured to add at least one member selected from the group consisting of a pole and a zero to a transfer function of the filter network; a passive filter coupled to the active filter and configured to add at least one pole to the transfer function of the filter network; and a non-inverting amplifier (e.g., a voltage buffer) having an input coupled to the passive filter and an output coupled to the active filter.

In some embodiments, the passive filter comprises a capacitor. In some embodiments, the passive filter comprises a resistor coupled between the output of the amplifier and the input of the non-inverting amplifier. In some embodiments, the capacitor has a first terminal coupled between the resistor and the input of the non-inverting amplifier and a second terminal coupled to a reference potential.

In some embodiments, the transfer function of the filter network has at least two poles and at least two zeros. In some embodiments, the filter network is a biquadratic filter and the transfer function has two poles and two zeros.

In some embodiments, the active filter comprises: a resistor coupled between the output of the non-inverting amplifier and the input of the amplifier; and a capacitor coupled between the output of the amplifier and the input of the amplifier.

In some embodiments, the amplifier has an open-loop gain that is at least 10 times larger than an open-loop gain of the non-inverting amplifier. In some embodiments, the open-loop gain of the amplifier is between 10 and 100 times larger than the open-loop gain of the non-inverting amplifier.

In some embodiments, the filter network further comprises a common mode voltage sensing circuit configured to measure a common mode voltage output by the non-inverting amplifier and generate a control signal for the amplifier based on the measured common mode voltage output by the non-inverting amplifier.

In some embodiments, the non-inverting amplifier comprises: a current source; and a transistor coupled to the transistor, the transistor having a gate terminal coupled to the input of the non-inverting amplifier and a source terminal coupled to the output of the non-inverting amplifier.

According to at least one aspect, a filter network is provided. The filter network comprises: an amplifier having an input and an output; a passive filter coupled to the output of the amplifier and configured to add at least one pole to a transfer function of the filter network; a voltage buffer having an input coupled to the passive filter and an output coupled to the input of the amplifier; and a circuit package housing the amplifier, the passive filter, and the voltage buffer.

In some embodiments, the filter network further comprises: a resistor coupled between the output of the voltage buffer and the input of the amplifier; and a capacitor coupled between the output of the amplifier and the input of the amplifier.

In some embodiments, the passive filter is a resistor-capacitor filter. In some embodiments, the passive filter comprises: a resistor coupled between the output of the amplifier and the input of the voltage buffer; and a capacitor having a first terminal coupled between the resistor and the input of the voltage buffer and a second terminal coupled to a reference potential.

In some embodiments, the amplifier has an open-loop gain that is larger than the open-loop gain of the voltage buffer.

According to at least one aspect, a filter network is provided. The filter network comprises: an amplifier having an input and an output; a passive filter coupled to the output of the amplifier and configured to add at least one pole to a transfer function of the filter network; and a voltage buffer means having an input coupled to the passive filter and an output coupled to the input of the amplifier.

In some embodiments, the voltage buffer means comprises: a first current source; and a first transistor coupled to the first current source, the first transistor having a gate terminal coupled to the input of the voltage buffer and a source terminal coupled to the output of the voltage buffer. In some embodiments, the voltage buffer means further comprises: a second current source coupled to the source terminal of the first transistor; and a second transistor having a gate terminal coupled to the first transistor and a drain terminal coupled to the output of the voltage buffer. In some embodiments, the voltage buffer means further comprises: a second current source; a second transistor having a gate terminal coupled to the second current source and a drain terminal coupled to the output of the voltage buffer; and a third transistor having a source terminal coupled to the first current source and a drain terminal coupled to the second current source.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

As described above, conventional biquadratic filters have a transfer function that is a ratio of two quadratic functions and are typically formed by cascading multiple active filters. The inventors have appreciated that such biquadratic filters, including the biquadratic filter 100 described above, have poor performance when driving a capacitive load. For example, the output of the conventional biquadratic filter may become non-linear and/or the bandwidth of the conventional biquadratic filter may be reduced. As a result, these conventional biquadratic filters may be unsuitable for use in communication systems employing more stringent communication standards, such as the IEEE 802.11ax and 5G cellular communication standards.

Accordingly, aspects of the present disclosure relate to filter networks that exhibit improved performance when driving a capacitive load at relatively high frequency, for example driving a load having a capacitance of at least approximately 8 picofarads (pF) at a frequency of 100 MHz with $3^{rd}$ order distortion better than 60 dBc. The filter networks described herein may provide improved linearity when driving capacitive loads. In some embodiments, the filter networks may replace the last active filter in the filter cascade with a passive filter coupled to a non-inverting amplifier. The non-inverting amplifier may include a voltage buffer, in these embodiments, the passive filter may be designed to add a pole and/or a zero to the transfer function of the filter network such that the transfer function of the filter network is still a ratio of quadratic functions (or higher order polynomial functions). The non-inverting amplifier (e.g., voltage buffer) may have a low open-loop gain (e.g., an open-loop gain that is no more than 100) and buffer the filters from the load. As a result, the performance of the filter network in driving a capacitive load is improved because the load is driven by the non-inverting amplifier (e.g., voltage buffer) instead of being directly driven by the last filter in the cascade. Further, the output of the non-inverting amplifier (e.g., voltage buffer) may be employed in a feedback circuit path back into one or more filters in the cascade. Thus, the non-inverting amplifier (e.g., voltage buffer) is integrated into the filter network and the output voltage of the non-inverting amplifier (e.g., voltage butler) is better controlled relative to a design that simply adds a voltage buffer to the output of a conventional biquadratic filter.

Figure 2:
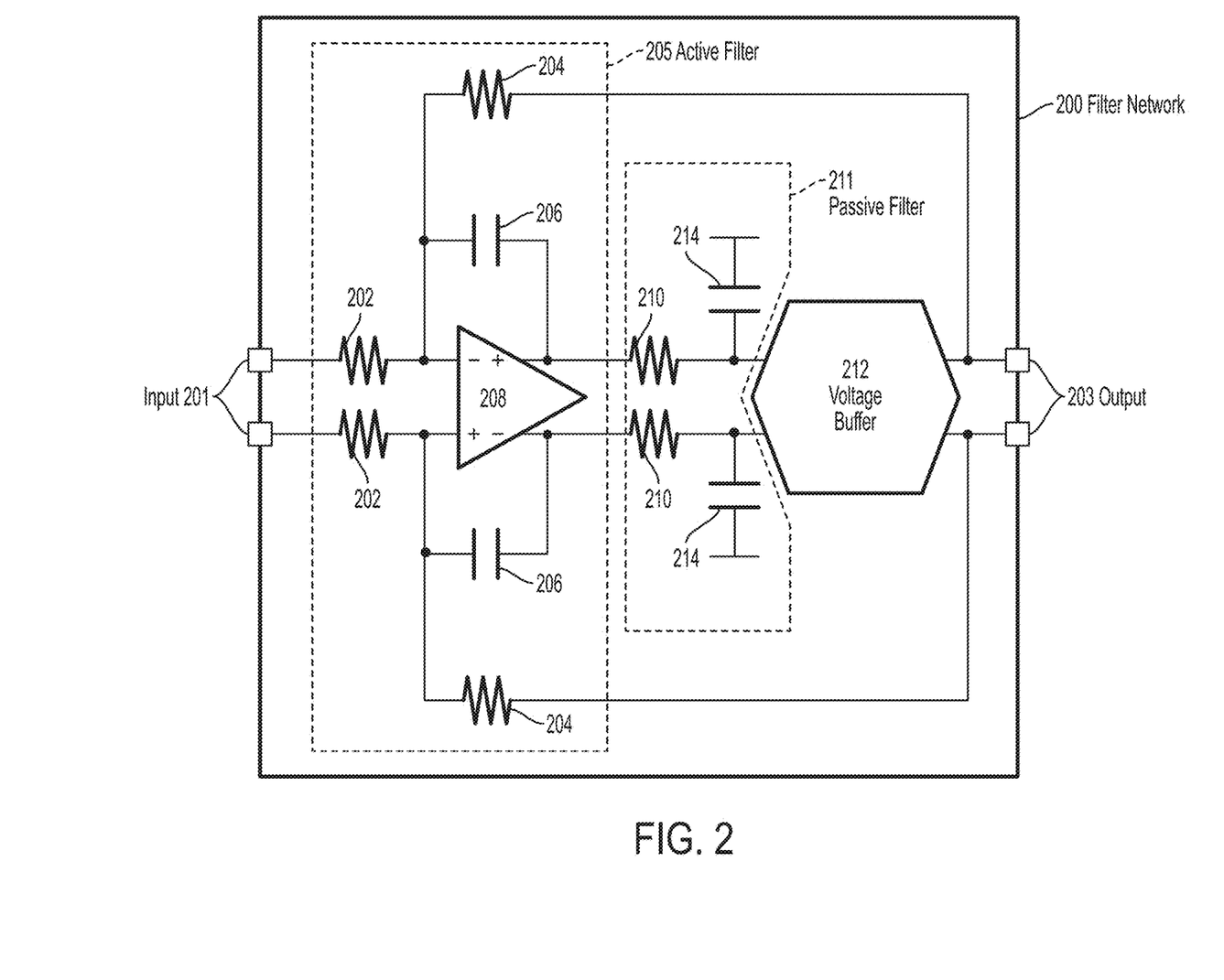
FIG. 2 is a schematic of an example filter network, according to some embodiments.

FIG. 2 shows a diagram of an example filter network 200 implemented as a biquadratic filter with a transfer function having two poles and two zeros. The filter network 200 receives an input signal at inputs 201 and provides an output signal to a load via outputs 203. The load may be, for example, a capacitive load. The filter network 200 may employ a cascade of filters to achieve the desired transfer function including an active filter 205 coupled to the input 201 and a passive filter 211 coupled to the active filter 205. The output of the cascade of filters may be provided as an input to a voltage buffer 212 that is coupled to the outputs 203. Thus, the voltage buffer 212 may drive the load coupled to the output 203 instead of the active filter 205 and/or the passive filter 211.

The active filter 205 may be configured to provide one or more poles and/or zeros to the transfer function of the filter network 200. The active filter 205 may comprise at least one active electrical component. Example active electrical components include transistors and devices that employ transistors such as amplifiers (e.g., an operational amplifier). The active filter 205 may further comprise one or more passive components, such as resistors, capacitors, inductors, and transformers.

The active filter 205 may be constructed in any of a variety of ways based on the desired transfer function of the filter network 200. As shown FIG. 2, the active filter 205 may comprise an amplifier 208 with an output coupled to an input of the amplifier 208 in a first feedback loop that comprises capacitors 206 ($C_1$). The output 203 of the filter network 200 may also be coupled to the input of the amplifier 208 in a second feedback loop that comprises resistors 204 ($R_3$). The input of the amplifier 208 may also be coupled to the input 201 of the filter network 200 via resistors 202 ($R_1$). Additionally, the first and/or second feedback loops may comprise additional components not shown in FIG. 2. For example, the first feedback loop may further comprise a resistor (not shown) that is coupled in parallel with the capacitor 206 between the input and output of the amplifier 208.

The amplifier 208 in the active filter 205 may have a higher open-loop gain than the voltage buffer 212. In some embodiments, the open-loop gain of the amplifier 208 may be at least one order of magnitude greater than the open-loop gain of the voltage buffer 212. For example, the open-loop gain of the amplifier 208 may be at least 10,000 and the open-loop gain of the voltage buffer 212 may be no more than 100. The amplifier 208 may be implemented as, for example, an operational amplifier.

The passive filter 211 may be configured to provide one or more poles and/or zeros to the transfer function of the filter network 200. For example, the passive filter 211 may be constructed to add at least one pole to the transfer function of the filter network 200. Unlike the active filter 205, the passive filter 211 may be constructed entirely of passive electrical components, such as resistors, capacitors, inductors, and transformers. Thus, the passive filter 211 may not comprise any active electrical components such as transistors. For example, the passive filter 211 may be implemented as a resistor-capacitor (RC) filter including at least one resistor and at least one inductor, a resistor-inductor (RL) filter including at least one resistor and at least one inductor, an inductor-capacitor (LC) filter including at least one inductor and at least one capacitor, and/or a resistor-inductor-capacitor (RLC) filter including at least one resistor, at least one inductor, and at least one capacitor.

The passive filter 211 may constructed in any of a variety of ways based on the desired transfer function of the filter network 200. As shown FIG. 2, the passive filter 211 is implemented as an RC filter that comprises resistors 210 ($R_4$) and capacitors 214 ($C_2$). The resistors 210 are coupled between the active filter 205 (e.g., the output of the amplifier 208) and the input of the voltage buffer 212. The capacitors 214 each have a first terminal coupled between one of the resistors 210 and the input of the voltage buffer 212 and a second terminal coupled to a reference potential (e.g., ground).

It should be appreciated that the filter network 200 may comprise more than one active filter 205 and/or more than one passive filter 211. For example, additional filters may be cascaded between the input 201 and the voltage buffer 211 to achieve a higher order polynomial functions in the transfer function for the filter network 200, such as a third or fourth order polynomial functions. Thus, the filter networks described herein are not limited to implementations that only employ a single active filter 205 and/or a single passive filter 211 as shown in FIG. 2.

The voltage buffer 212 may be configured to buffer the cascade of filters from the load coupled to the outputs 203. Thus, the voltage buffer 212 may drive the load instead of the active filter 205 or the passive filter 211. The output of the voltage buffer 212 may closely (or exactly) track the input of the voltage buffer 212 received from the passive filter 211. The voltage buffer 212, unlike the amplifier 208 in the active filter 205, may have a low open-loop gain (e.g., an open-loop gain of no more than 100). For example, the voltage buffer 212 may have an open-loop gain of approximately 1. Accordingly, the construction of the voltage buffer 212 may be substantially simpler than the construction of the amplifier 208. For example, the voltage buffer 212 may comprise a limited number of transistors (e.g., less than 15 transistors, less than 12 transistors, less than 10 transistors, less than 8 transistors, less than 5 transistors, etc.). Example implementations of the voltage buffer 212 are described further below with reference to FIGS. 4A, 4B, and 4C.

In some embodiments, the filter network 200 may have an equivalent transfer function as the biquadratic filter 100 shown in FIG. 1. While the transfer function for the filter network 200 does not include the term $R_2$ because the resistors associated with the term $R_2$ have been removed, a new term $A_{SF}$ is added that is representative of the gain of the voltage buffer 212. The transfer function of the filter network 200 is shown below in equation 2 as $T_2(s)$:

$$T_2(s) = \frac{R_3/R_1}{s^2 \Big/ \frac{1}{(R_4/A_{SF})*C_2*R_3*C_1} + s \Big/ \frac{A_{SF}}{R_3*C_1} + 1} \quad (2)$$

Given the location of the new term $A_{SF}$ in the transfer function of the filter network 200, the transfer function of the filter network 200 may be made equivalent to the transfer function of the biquadratic filter 100 by selecting the gain of the voltage buffer 212 such that the term $A_{SF}$ equals the ratio of the terms $R_4$ and $R_2$ as shown in equation 3 below:

$$A_{SF} = \frac{R_4}{R_2} \quad (3)$$

Replacing the term $A_SF$ in equation (2) with the ratio of the terms $R_4$ and $R_2$ as shown in equation (3) yields an identical transfer function to the transfer function for the biquadratic filter 100 as shown below by the transfer function $T_3(s)$ in equation (4) below:

$$T_3(s) = \frac{R_3/R_1}{s^2 \Big/ \frac{1}{R_2*C_2*R_3*C_1} + s \Big/ \frac{R_4/R_2}{R_3*C_1} + 1} \quad (4)$$

Accordingly, the filter network 200 may have an equivalent transfer function as the biquadratic filter 100 shown in FIG. 1 while providing improved performance.

Figure 3:
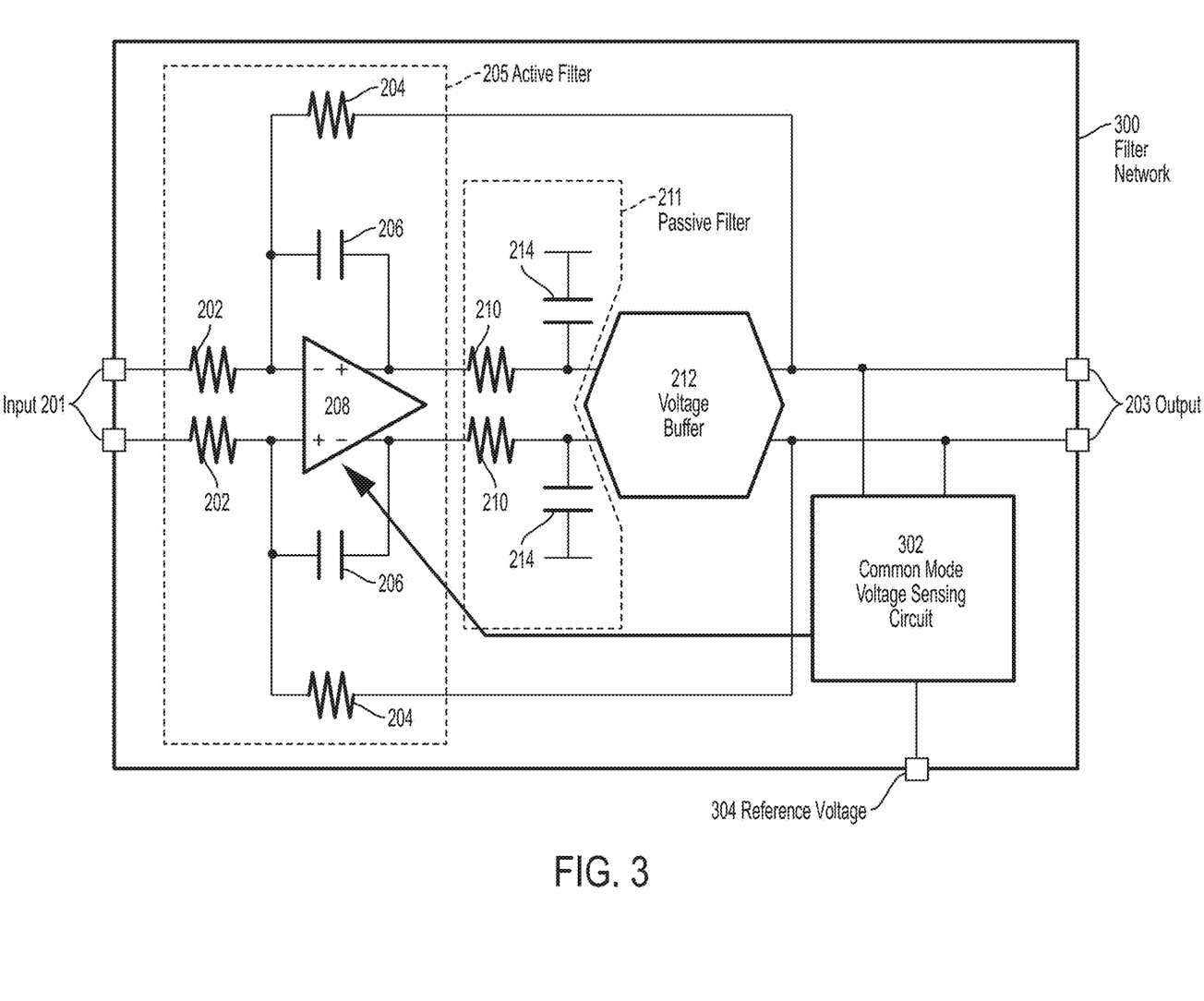
FIG. 3 is a schematic of another example filter network, according to some embodiments.

In some embodiments, the filter network 200 may further include one or more components to reduce the common mode voltage at the output 203 of the filter network. An example of such a filter network is shown by filter network 300 in FIG. 3. Relative to the filter network 200 in FIG. 2, the filter network 300 adds a common mode voltage sensing circuit 302 and a reference voltage terminal 304. The common mode voltage sensing circuit 302 is coupled to the output of the voltage buffer 212, the amplifier 208, and the reference voltage terminal 304. The common mode voltage sensing circuit 302 may be configured to measure a common mode voltage at the output of the voltage buffer 212 and compare the common mode voltage at the output of the voltage buffer 212 with a reference voltage received from the reference voltage terminal 304. The common mode voltage sensing circuit 302 may generate a feedback signal for the amplifier 208 based on the difference between the measured common mode voltage at the output of the voltage buffer 212 and the reference voltage received from the reference voltage terminal 304. The amplifier 208 may, in turn, employ the feedback signal from the common mode voltage sensing circuit 302 to adjust the common mode voltage at the output of the amplifier 208 and, thus, the filter network 300. As a result, the common mode voltage at the output of the amplifier 208 may be driven towards (and/or made equal to) to the reference voltage applied to the reference voltage terminal 304.

It should be appreciated that the filter networks described herein including filter networks 200 and 300 may be implemented using one or more semiconductor dies. For example, the components of the filter network may be implemented in a single semiconductor die that may be integrated into a circuit package. In another example, the components of the filter network may be distributed into a plurality of semiconductor dies that may be electrically connected. The plurality of dies may be integrated into a single circuit package or multiple circuit packages.

As discussed above, a voltage butler (e.g., voltage buffer 212) may be employed in the filter network (e.g., filter networks 200 and/or 300) to drive the load. It should be appreciated that the voltage butler may be constructed in any of a variety of ways. For illustration, three different example voltage buffer implementations are shown by voltage buffers 400A, 400B, and 400C in FIGS. 4A, 4B, and 4C, respectively. Each of the voltage buffers 400A, 400B, and 400C receive an input signal at an input 401 and provide an output signal at an output 403.

Figure 4A:
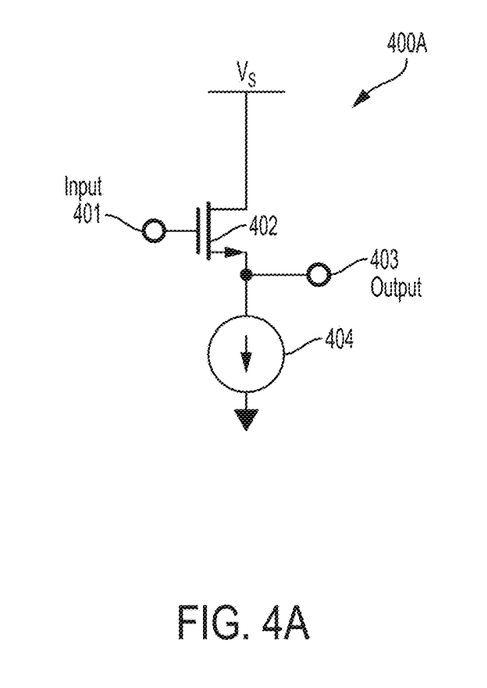
FIGS. 4A, 4B, and 4C each are schematics of example voltage buffers, according to some embodiments.

As shown in FIG. 4A, the voltage buffer 400A comprises a transistor 402 (shown as an N-type transistor) coupled to a current source 404. The transistor 402 has a drain terminal coupled to a supply voltage ($V_S$), a source terminal coupled to the output 403, and a gate terminal coupled to the input 401. The current source 404 is coupled between the source terminal of the transistor 402 and a reference potential (e.g., ground).

Figure 4B:
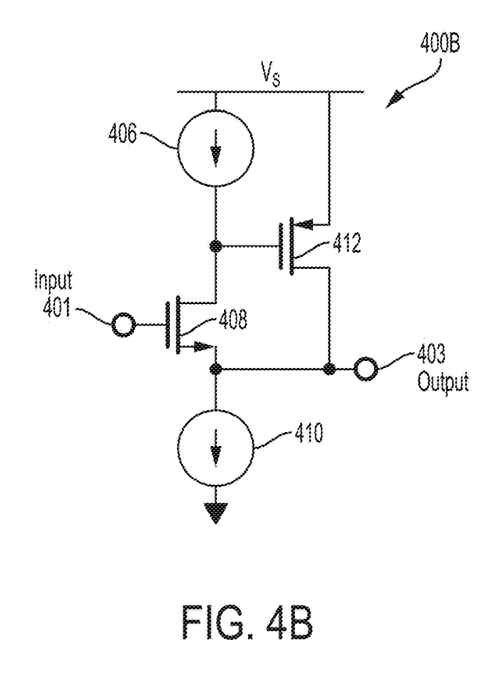

As shown in FIG. 4B, the voltage buffer 400B comprises a first current source 406 coupled to a first transistor 408 (shown as an N-type transistor) and a second current source 410. The first transistor 408 has a drain terminal coupled to the first current source 406, a gate terminal coupled to the input 401, and a source terminal coupled to the second current source 410 and the output 403. The first current source 406 is coupled between the supply voltage ($V_S$) and the drain terminal of the first transistor 408. The second current source 410 is coupled between the source terminal of the first transistor 408 and a reference potential (e.g., ground). The voltage buffer 400B further comprises a second transistor 412 (shown as a P-type transistor) that has a gate terminal coupled to the first current source 406, a source terminal coupled to the supply voltage ($V_S$), and a drain terminal coupled to the output 403.

Figure 4C:
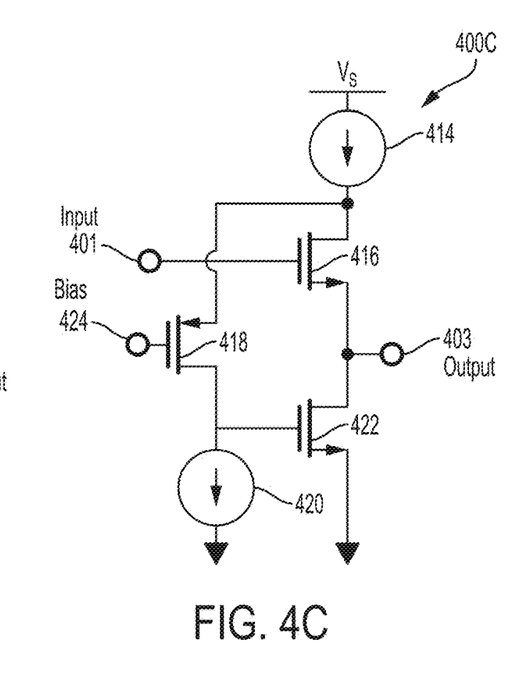

As shown in FIG. 4C, the voltage buffer 400C comprises a first current source 414 coupled to a first transistor 416 (shown as an N-type transistor) and a second transistor 422 (shown as an N-type transistor). The voltage buffer 400C further comprises a third transistor 418 (shown as an P-type transistor) and a second current source 420 coupled to the first current source 414. The first transistor 416 has a drain terminal coupled to the first current source 414, a gate terminal coupled to the input 401, and a source terminal coupled to the output 403. The second transistor 422 has a drain terminal coupled to the output 403, a gate terminal coupled to the second current source 420, and a source terminal coupled to the reference potential (e.g., ground). The third transistor 418 has a source terminal coupled to the first current source 414, a gate terminal coupled to a bias terminal 424 (e.g., configured to receive a bias voltage such as a direct current (DC) bias voltage), and a drain terminal coupled to the second current source 420. The transistor 418 may, for example, form a common-gate feedback transistor to enable push-pull operation of the voltage buffer 400C. The first current source 414 is coupled between the supply voltage ($V_S$) and the drain terminal of the first transistor 416. The second current source 420 is coupled between the drain terminal of the third transistor 418 and the reference potential (e.g., ground).

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

It should be appreciated that the above described transistors may be implemented in any of a variety of ways. For example, one or more of the transistors may be implemented as bipolar junction transistors or field-effect transistors (FETs), such as metal-oxide semiconductor field-effect transistors (MOSFETs), junction field-effect transistors (JFETs), and heterostructure field-effect transistors (HFETs). In instances where one or more transistors described herein are implemented as BJTs, the gate, source, and drain terminals described above for such transistors may be base, emitter, and collector terminals, respectively.

The terms "approximately," "about," and "substantially" may be used to mean within ±10% of a target value in some embodiments. The terms "approximately," "about," and "substantially" may include the target value. It should lye appreciated that the terms "approximately," "about," and "substantially" may be used to refer to a range smaller than ±10% of a target value such as: ±5% of a target value, ±2.5% of a target value, and ±1% of a target value.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A filter network, comprising:
   an active filter comprising an amplifier, wherein the active filter is configured to add at least one member selected from the group consisting of a pole and a zero to a transfer function of the filter network, the amplifier comprising a first input, a second input, a first output and a second output;
   a passive filter coupled to the active filter and configured to add at least one pole to the transfer function of the filter network, the passive filter comprising at least one first passive component coupled to the first output of the amplifier and at least one second passive component coupled to the second output of the amplifier; and
   a non-inverting amplifier having a first input coupled to the at least one first passive component, a second input coupled to the at least one second passive component, a first output coupled to the first input of the amplifier and a second output coupled to the second input of the amplifier,
   wherein the non-inverting amplifier does not include an operational amplifier, and
   wherein the amplifier has an open-loop gain that is at least 10 times larger than an open-loop gain of the non-inverting amplifier.

2. The filter network of claim 1, wherein the at least one first passive component comprises a capacitor.

3. The filter network of claim 2, wherein the at least one first passive component further comprises a resistor.

4. The filter network of claim 3, wherein the capacitor has a first terminal coupled between the resistor and the first input of the non-inverting amplifier and a second terminal coupled to a reference potential.

5. The filter network of claim 1, wherein the transfer function of the filter network has at least two poles and at least two zeros.

6. The filter network of claim 5, wherein the filter network is a biquadratic filter network and wherein the transfer function has two poles and two zeros.

7. The filter network of claim 1, wherein the active filter comprises:
a resistor coupled between the first output of the non-inverting amplifier and the first input of the amplifier; and
a capacitor coupled between the first output of the amplifier and the first input of the amplifier.

8. The filter network of claim 1, wherein the open-loop gain of the amplifier is between 10 and 100 times larger than the open-loop gain of the non-inverting amplifier.

9. The filter network of claim 1, further comprising a common mode voltage sensing circuit configured to measure a common mode voltage output by the non-inverting amplifier and generate a control signal for the amplifier based on the measured common mode voltage output by the non-inverting amplifier voltage buffer.

10. The filter network of claim 1, wherein the non-inverting amplifier comprises:
a current source; and
a transistor coupled to the current source, the transistor having a gate terminal coupled to the first input of the non-inverting amplifier and a source terminal coupled to the first output of the non-inverting amplifier.

11. A filter network, comprising:
an amplifier having a first input, a second input, a first output and a second output;
a passive filter coupled to the first and second outputs of the amplifier and configured to add at least one pole to a transfer function of the filter network;
a voltage buffer having first and second inputs coupled to first and second outputs of the passive filter, respectively, and first and second outputs coupled to the first and second inputs of the amplifier, respectively; and
a circuit package housing at least the amplifier, the passive filter, and the voltage buffer,
wherein the voltage buffer does not include an operational amplifier, and
wherein the amplifier has an open-loop gain that is at least 10 times larger than the open-loop gain of the voltage buffer.

12. The filter network of claim 11, further comprising:
a resistor coupled between the first output of the voltage buffer and the first input of the amplifier; and
a capacitor coupled between the first output of the amplifier and the first input of the amplifier.

13. The filter network of claim 11, wherein the passive filter is a resistor-capacitor filter.

14. The filter network of claim 13, wherein the passive filter comprises:
a resistor coupled between the first output of the amplifier and the first input of the voltage buffer; and
a capacitor having a first terminal coupled between the resistor and the first input of the voltage buffer and a second terminal coupled to a reference potential.

15. A filter network, comprising:
an amplifier having a first input, a second input, a first output and a second output;
a passive filter coupled to the first and second outputs of the amplifier and configured to add at least one pole to a transfer function of the filter network; and
a voltage buffer means having first and second inputs coupled to the passive filter and first and second outputs coupled to the first and second inputs of the amplifier, respectively,
wherein the voltage buffer means does not include an operational amplifier, and
wherein the amplifier has an open-loop gain that is at least 10 times larger than an open-loop gain of the voltage buffer means.

16. The filter network of claim 15, wherein the voltage buffer means comprises:
a first current source; and
a first transistor coupled to the first current source, the first transistor having a gate terminal coupled to the first input of the voltage buffer means and a source terminal coupled to the first output of the voltage buffer means.

17. The filter network of claim 16, wherein the voltage buffer means further comprises:
a second current source coupled to the source terminal of the first transistor; and
a second transistor having a gate terminal coupled to the first transistor and a drain terminal coupled to the first output of the voltage buffer means.

18. The filter network of claim 16, wherein the voltage buffer means further comprises:
a second current source;
a second transistor having a gate terminal coupled to the second current source and a drain terminal coupled to the first output of the voltage buffer means; and
a third transistor having a source terminal coupled to the first current source and a drain terminal coupled to the second current source.

19. The filter network of claim 1, wherein the open-loop gain of the non-inverting amplifier is no more than 100.

20. The filter network of claim 15, wherein the open-loop gain of the voltage buffer means is no more than 100.

* * * * *